United States Patent [19]
Enke

[11] Patent Number: 4,981,071
[45] Date of Patent: Jan. 1, 1991

[54] MACHINE ELEMENT WITH COATING

[75] Inventor: Knut Enke, Johannesberg, Fed. Rep. of Germany

[73] Assignee: Leybold Aktiengesellschaft, Hanau I, Fed. Rep. of Germany

[21] Appl. No.: 293,223

[22] Filed: Jan. 4, 1989

[30] Foreign Application Priority Data

Nov. 3, 1988 [DE] Fed. Rep. of Germany ....... 3837306

[51] Int. Cl.$^5$ ........................... F02F 7/00; B05D 3/06
[52] U.S. Cl. ...................................... 92/261; 92/223; 427/38; 427/39
[58] Field of Search ................ 92/261, 172, 222, 223; 427/38, 39, 249, 255.2; 118/723

[56] References Cited

U.S. PATENT DOCUMENTS

| | | |
|---|---|---|
| 3,124,854 | 3/1964 | Dore . |
| 3,193,399 | 7/1965 | Washburn . |
| 3,533,436 | 10/1970 | Parkison . |
| 3,683,965 | 8/1972 | McClure et al. . |
| 3,810,602 | 5/1974 | Parkinson . |
| 3,822,928 | 7/1974 | Smolinsky et al. . |
| 3,834,416 | 9/1974 | Parkison . |
| 3,857,682 | 12/1974 | White . |
| 4,074,671 | 2/1978 | Pennila ............................. 92/223 X |
| 4,096,325 | 6/1978 | Kabacki . |
| 4,136,365 | 1/1979 | Wydeven et al. . |
| 4,450,787 | 5/1984 | Weakliem et al. ................... 118/723 |
| 4,452,686 | 6/1984 | Axenov et al. ................. 118/723 X |
| 4,525,417 | 6/1985 | Dimigen et al. . |
| 4,564,533 | 1/1986 | Yamazaki ............................... 427/39 |
| 4,583,492 | 4/1986 | Cowher et al. ...................... 118/723 |
| 4,608,943 | 9/1986 | Doehler et al. ................. 118/723 X |
| 4,615,298 | 10/1986 | Yamazaki . |
| 4,626,447 | 12/1986 | Doehler et al. ................. 118/723 X |
| 4,636,401 | 1/1987 | Yamazaki et al. ..................... 427/39 |
| 4,647,472 | 3/1987 | Hiraki et al. ........................... 427/39 |
| 4,683,809 | 8/1987 | Taylor ................................... 92/208 |
| 4,685,487 | 8/1987 | Derdack et al. . |
| 4,759,947 | 7/1988 | Ishihara et al. ....................... 427/38 |
| 4,762,730 | 8/1988 | Enke et al. . |
| 4,767,336 | 8/1988 | Yamazaki ......................... 427/39 X |
| 4,798,770 | 1/1989 | Donomoto et al. .............. 92/223 X |
| 4,856,758 | 8/1989 | Knapp . |

FOREIGN PATENT DOCUMENTS

| | | |
|---|---|---|
| 87836 | 9/1983 | European Pat. Off. . |
| 1671018 | 9/1971 | Fed. Rep. of Germany . |
| 2616339 | 12/1976 | Fed. Rep. of Germany . |
| 8012995 | 9/1980 | Fed. Rep. of Germany . |
| 3509572 | 7/1986 | Fed. Rep. of Germany . |
| 3538261 | 4/1987 | Fed. Rep. of Germany . |
| 3624467 | 1/1988 | Fed. Rep. of Germany . |
| 3733117 | 4/1988 | Fed. Rep. of Germany . |
| 3706218 | 9/1988 | Fed. Rep. of Germany . |
| 1583349 | 1/1981 | United Kingdom .................. 92/223 |

OTHER PUBLICATIONS

Patents Absts. of Japan-M-452-2/8, 1986, vol. 10, No. 3.

Primary Examiner—Edward K. Look
Attorney, Agent, or Firm—Felfe & Lynch

[57] ABSTRACT

On a machine element of a metallic material, for example, a piston or a piston rod (7, 7') for a shock absorber for a motor vehicle, with at least one hard-material coating deposited on the machine element, the hard-material coating essentially consists of an alloy of silicon and carbon, preferably of $Si_xC_{1-x}$, x having a value of from 0 to 1. The deposition of the hard-material coating occurs on the cathode or the anode of a plasma CVD unit at a pressure of the gas or gas mixture in the deposition chamber (1) of between $10^{-4}$ and 20 millibars.

16 Claims, 2 Drawing Sheets

MACHINE ELEMENT WITH COATING

BACKGROUND OF THE INVENTION

The invention relates to a machine element of a metallic material, particularly a piston and piston rod, for a shock absorber for motor vehicles, with at least one hard-material coating deposited on the machine element.

In hydraulics and pneumatics, the piston of a shock absorber is a machine element that is subjected to particularly high mechanical stresses. Seals are intended to prevent the leakage of hydraulic oil from the chamber in which the piston moves. To reduce wear and prevent corrosion of the piston, electrodeposited hard chromium coatings are used, among others.

Despite the pronounced hardness of chromium coatings, the service life of components so coated is regarded as inadequate. Moreover, the corrosion protection is occasionally considered not fully satisfactory. Also a low coefficient of sliding friction is desired. Finally, the stringent requirements on environmentally benign disposal of the electrolytic baths necessary for chromizing pose a special problem.

It is further known that hard, amorphous, hydrogen-containing carbon (a—C:H) coatings, either in the "pure" form or with admixtures of other elements, have low coefficients of sliding friction.

Finally, the deposition of silicon and carbon-containing coatings from organosilicon compounds by means of a glow discharge is also known.

The copending U.S. patent application Ser. No. 271,176 discloses a sealing element consisting of a ceramic sealing member around which water circulates, and having a platelike, pistonlike or spherical shape, with a hard-material coating which renders the sealing element extremely wear-resistant and assures, moreover, that the sealing element slides easily on its seat without the use of a separate lubricant, the sliding motions being relatively slow.

SUMMARY OF THE INVENTION

The principal objects of the present invention are to overcome the drawbacks of chromium-coated metallic machine elements which slide rapidly on each other and to provide a coating that offers high corrosion protection and a low coefficient of sliding friction along with high wear resistance.

In accordance with the invention, these objects are accomplished in that the hard-material coating is essentially formed of an alloy of silicon and carbon, preferably of $Si_xC_{1-x}$, x having a value of from 0 to 1.

The hard-material coating of silicon and/or carbon preferably contains the elements oxygen and nitrogen.

For the deposition of hard-material coatings on the machine element, a process is advantageously used in which the deposition of the hard-material coating takes place on the cathode or on the anode of a plasma CVD unit.

The deposition of such hard-material coatings is employed in the case of a piston component, for example, which on the side facing the sealing ring is provided with a firmly adhering carbon-containing hard-material coating.

This hard-material coating preferably contains, in addition to carbon, hydrogen, which represents about 1 to 50 atomic percent of the substance. Without further additives (a—C:H), this amorphous hydrogen-containing carbon adheres only very poorly to certain materials, especially steel. It has now been found, quite unexpectedly, that even very minor additions (a few percent) of silicon in the carbon coatings are sufficient to significantly increase the adhesion of these coatings. The hardness and the friction and anticorrosion properties of the coatings are not adversely affected thereby. The entire coating may be made of carbon with an admixture of silicon, or a thinner, well-adhering base or bonding coat of carbon with silicon may be deposited first and a thicker, silicon-free carbon coat, or a carbon coat having a proportion of silicon different from that of the bonding coat, on top of it.

Surprisingly, rods or cylinders so coated exhibit low friction in contact with sealing materials, for example, plastics or metals.

A process suitable for accomplishing the aforesaid object is plasma-activated chemical vapor deposition (PACVD, PCVD), in which the parts to be coated need not be additionally heated.

However, it is also possible to combine conventional (high-temperature) CVD with PCVD. In this case, the machine elements to be coated are heated to temperatures of several hundred (and up to over a thousand) degrees Celsius. With this process, also called pyrolysis, carbon can be deposited in a hydrocarbon atmosphere, for example; however, this carbon has graphitelike properties, in other words, it is soft, nontransparent and electrically conductive. Hard, electrically insulating carbon coatings with diamondlike properties are obtained only through supplementary ion bombardment (or through ion bombardment alone), by means of a flow discharge (plasma), for example, or of a separate ion gun. Heating combined with a glow discharge can also be employed, as plasma-enhanced chemical vapor deposition (PECVD). When heating is dispensed with, plastics sensitive to high temperatures can also be coated by CVD.

The invention lends itself to a wide variety of implementation modes. An apparatus suitable for the coating of piston rods for shock absorbers is illustrated diagrammatically in the accompanying drawings.

For a full understanding of the present invention, reference should now be made to the following description of the preferred embodiments of the invention and to the accompanying drawings.

DESCRIPTION OF THE PREFERRED EMBODIMENTS

Figure 1:
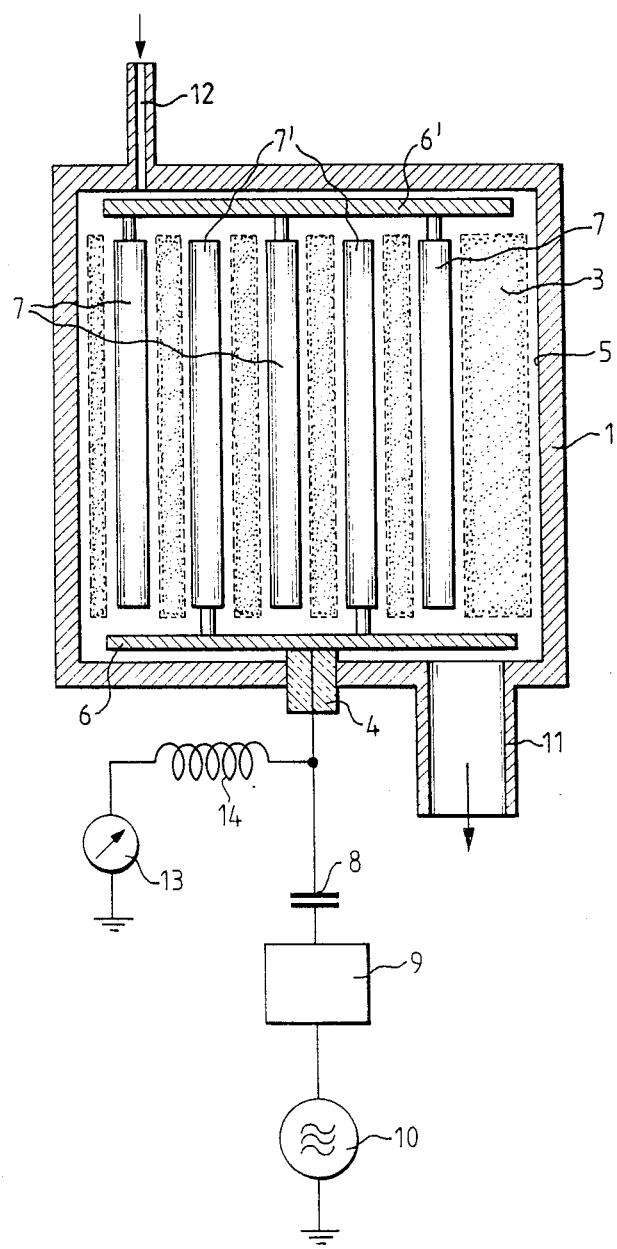
FIG. 1 is a side elevation and section of the coating apparatus according to the present invention.

In the apparatus of FIG. 1, the parts 7 and 7' to be coated, along with their holders 6 and 6', respectively form, in view of the necessary ion bombardment, the electrodes of a diode array for the production of a glow discharge 3. The apparatus itself consists of an electrically conductive chamber 1, an electrically insulating feed-through bushing 4 which establishes the electrical connection between the workpiece holder 6 and the electrical power supply, consisting of a radio-frequency generator 10, a impedance transformer 9 and a coupling capacitor 8. A large-diameter pipe 11 serves as connecting channel between the coating chamber 1 and a pump stand (not shown). When the gas supply (not shown) connected through a small-diameter pipe 12 to the chamber 1 is shut off, the pump able to produce a vacuum which after a few minutes corresponds to a pressure of from $10^{-8}$ to $10^{-3}$ millibars, and preferably from $10^{-6}$ to $10^{-4}$ millibars. This pressure range does not constitute a significant limitation of the process since at lower pump outputs corresponding to higher residual-gas pressures the oxygen from the residual gas is partially incorporated into the coatings, because of its high affinity for silicon. This can be tolerated to a certain degree. However, in borderline cases the organosilicon necessary for coating formation is increased in oxidation state to the point where the coatings cannot any longer be referred to as silicon/carbon but are quartz, in other words, silica.

The vacuum chamber is advantageously made of an electrically insulating material, for example, quartz, the electric field necessary for production of a glow discharge being coupled in through coils or external or internal electrodes or through a microwave cavity resonator. Really hard carbon-containing coatings are obtained when the parts to be coated are placed on a workpiece holder 6 and 6' which is made negative with respect to the plasma 3. This can be done through a dc voltage applied to the workpiece holders, or advantageously by means of the radio-frequency setup consisting of the components 8, 9 and 10. In the latter case, the electrodes 6 and 6', the workpiece holders and the substrates 7 and 7' which are electrically connected to them become negatively charged with respect to the plasma 3 in average time, due to different mobilities of electrons and ions emanating from the plasma, when the connection between the radio-frequency generator 10 and the workpiece holder 6 is broken with respect to the dc voltage by means of a capacitor 8. The cathode dc voltage $U_B$ to ground is usually measured between the capacitor 8 and the workpiece holder 6 by means of a dc voltmeter 13. To prevent the radio frequency required for the process from being shunted through the meter, a radio-frequency choke 14 is inserted in the circuit ahead of the meter. When a great many substrates 7, 7' are being coated at the same time, the surface-area ratio of the substrates 7 suspended from the grounded holder 6', plus the surface area of the chamber wall, to the substrates 7' standing on the holder 6' connected to radio frequency is nearly equal to one. This means that $U_B$ is nearly equal to zero. Ion bombardment nevertheless occurs since the potential difference between the rods and the plasma is sufficiently high is of the order of one-half the RF voltage $U_{RF}$ present at the holder 6, which is readily measurable with an RF amplitude measuring instrument. Measurement of the potential difference between the plasma and one of the electrodes is accomplished less readily and calls for the use of a Langmuir probe, for example. The use of radio frequency is indispensable for the production of electrically insulating carbon-containing coatings of a thickness greater than about 0.5 micron, since when dc voltage is used, insulating coatings above a critical thickness that is insufficient for adequate protection will interrupt the flux of electrons and ions and thus bring the coating process to a halt.

Figure 2:
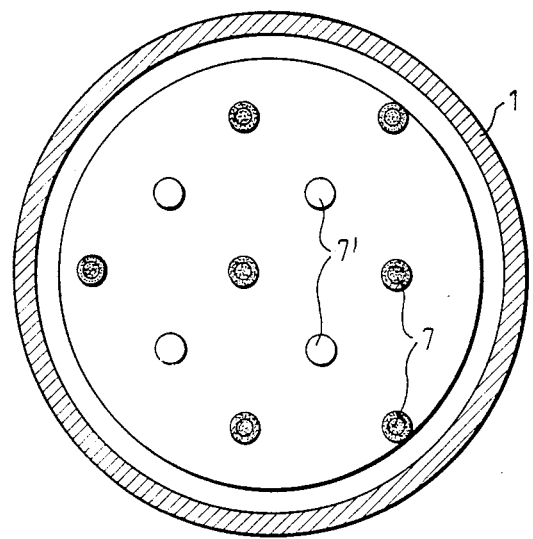
FIG. 2 is a plan view of a piston-rod array in the coating apparatus of FIG. 1.

FIG. 2 shows the array of rod-shaped substrates in a plan view. The solid circles represent the rods 7 mounted on the grounded holder 6, and the open circles the rods 7 fastened to the holder 6. Every rod is thus surrounded by four rods of opposite polarity, which results in an electric field distribution that is advantageous for the maintenance of a glow discharge. However, other geometries are also conceivable. What is important is that an electric field sufficiently strong for a glow discharge is present in the immediate vicinity of a part to be coated.

Figure 3:
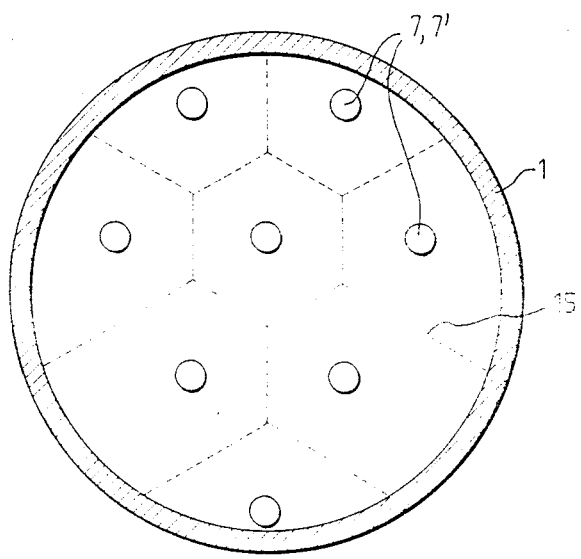
FIG. 3 is a plan view of an alternative piston-rod array in the coating apparatus of FIG. 1.

A particularly uniform field distribution, and hence a particularly homogeneous coating, is achievable with an arrangement such as shown in FIG. 3. There 7 and 7' designate the rods to be coated, while 15 denotes electrically conductive, gas-permeable walls of opposite polarity. In this arrangement, however, the advantage obtained with that of FIG. 2, namely, that the grounded rods 7 of opposite polarity, which are important for an advantageous field distribution, are coated at the same time as the other rods 7', is lacking. In other words, only half as many rods 7, 7' can be coated with the arrangement of FIG. 3 as with that of FIG. 2. Moreover, the device of FIG. 2 is much easier to handle in the unloading and reloading of the coating chamber than the one of FIG. 3. Furthermore, the coating deposited also on the gas-permeable walls 15 has to be removed from time to time.

In addition to electrical energy, which is coupled into the coating chamber 1 by way of the workpiece holder 6, the production of a glow discharge also requires a gas of a pressure ranging from $10^{-4}$ to several millibars in that chamber. This pressure range is added to the independent glow discharge, in which the gas is partially chemically excited, ionized, and in the case of polyatomic gases decomposed into radicals. The rest of the atoms or molecules remains neutral. When inert gases are used, the apparatus shown in FIG. 1 represents a cathode sputtering unit in which the workpiece holders 6 and 6' and the substrates 7 and 7' attached to them are etched physically by ion bombardment. This cleaning of the workpieces prior to the actual coating operation is an important step, though not absolutely necessary in all cases.

If halogen-containing gases such as $CF_4$, $SF_6$, $C_2Cl_2F_2$ or $BCl_3$ are used instead of inert gases, plasma-chemical etching, long used in the semiconductor industry to produce ultrafine structures, is involved.

When the working gas further contains hydrogen, either in the molecule or as an admixture, then, under appropriate conditions which are determined mainly by the electrical power coupled into the coating chamber and by the pressure of the working gas, firm coatings are deposited which coat all parts located in the chamber, including the chamber walls 5. The surfaces of the workpiece holders and of the rods 7 and 7' attached to them represent a special case since they are constantly exposed during the coating operation to an ion bombardment which is adjustable by means of the electrical power and which essentially imparts to the coatings their pronounced hardness.

Gases or mixtures of gases containing silicon and carbon, and so much hydrogen, in contrast to halogens, that coating predominates over plasma-chemical etching, have been found to be particularly well-suited process gases for the coating of metals. A mixture of $SiCl_4$ and $CF_4$, for example, can be expected to result in etching over a wide range of electrical power and gas pressure, whereas the mere replacement of $CiCl_4$ by $SiH_4$ in this gas mixture will yield an SiC-like hard coating. The hydrogen combines with the fluorine to give HF gas, which is removed from the chamber by means of the pumps of the apparatus shown in FIG. 1. What remains is a firm SiC coating.

However, not only silane, SiH4, which ignites spontaneously in air, or the etching gas CF4 can be used to advantage; rather, the large group of organosilicon compounds is suitable for use. These are liquids whose vapor pressure is high enough even at room temperature, in the case of many of them, for them to be drawn as gases through the pipe 11 into the coating chamber by the vacuum therein alone.

Suitable gases are, for example, tetramethylsilane, hexamethyldisilane, hexamethyldisiloxane, hexamethyldisilazane, vinyldimethylethoxysilane, tetraethoxysilane or any other siloxanes, silazanes or silanes containing methyl, vinyl, phenyl or alkoxy groups, but also their halogenated equivalents such as dichloromethylsilane or trifluorosilane, for example. This selection does not signify a limitation. There merely has to be assurance that the process gas or mixture contains silicon and carbon and that the concentration ratio of hydrogen to halogen is such that no plasma-chemical etching occurs but rather a deposition of a firm coating. In this sense, the molecular structure of the process gases is immaterial for the purposes of the invention. Thus, the molecules may be linear, branched or cyclic. On striking the workpiece holders and the parts to be coated there present, the molecules lose their original structure.

EXAMPLE 1

The deposition chamber was evacuated to a pressure of $10^{-5}$ millibars. Argon was then introduced and the gas pressure was set to 8 microbars by means of a metering valve. After the radio-frequency generator had been switched on, a glow discharge was created. By varying the generator output, the RF electrode voltage was set to 500 volts. Ten minutes later, the argon valve was closed and at the same time the metering valve for tetramethylsilane (TMS) was opened to the point where a pressure of 20 microbars developed in the chamber. The generator output was readjusted so that the RF electrode voltage was 600 volts. After half an hour, the generator was turned off and the TMS valve was closed. The deposition chamber was opened and the steel rods were taken out. A bright dark-gray hard-material coating had deposited on their surfaces.

EXAMPLE 2

The same process step as in Example 1, were used but with the following changed parameters:
The coating gas hexamethyldisiloxane (HMDSO) was introduced. The RF electrode voltage was 600 volts.
After half an hour, a bright dark-brown coating 2 microns thick had been deposited.

EXAMPLE 3

The same process steps as in Example 1 were used but with the following changed process parameters:
The gas hexamethyldisilazane (HMDSN) was used. The RF electrode voltage was 450 volts.
After half an hour, a bright dark-brown coating 1.5 microns thick had been deposited.

EXAMPLE 4

The same process steps as in Example 1 were used but with the following changed process parameters:
A mixture of 10% TMS and 90% hexane was used. The gas pressure was set to 80 microbars, and the RF electrode voltage to 400 volts.
After half an hour, a bright black coating 3 microns thick had been deposited.

EXAMPLE 5

The same process steps as in Example 1 were used but with the following changed process parameters:
TMS was introduced, the pressure was set to 40 microbars and the RF electrode voltage to 900 volts. After 5 minutes, the hexane valve was opened and the TMS valve was at the same time closed to the point that a mixing ratio of TMS to hexane of 1:5 was obtained. The total pressure was set to 30 microbars and the RF electrode voltage to 450 volts.
After half an hour, a well-adhering bright black coating had been deposited.
The coated rods were subjected to a 20-hour salt-fog test, after which they showed practically no attack by corrosion.
Installed in an automobile shock absorber, the protective coatings were still intact after $10^6$ strokes.

There has thus been shown and described a novel invention which fulfills all of the objects and advantages sought therefor. Many changes, modifications, variations and other uses and applications of the invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention which is limited only by the claims which follow.

I claim:
1. A machine assembly comprising:
first and second machine elements slidingly engaging one another;
said first machine element comprising:
a substrate of a metallic material; and
a hard-material coating deposited on said substrate and slidingly engaging the second machine element;
the hard-material coating including a base coat deposited directly onto the metallic substrate, said coat being essentially formed of an amorphous mixture of silicon and carbon according to the formula:

$$Si_xC_{1-x},$$

wherein x has a value greater than 0 and less than 1; and the hard-material coating including at least one additional coating deposited over the base coating; wherein the additional coating deposited over the base coating is formed essentially of an amorphous mixture of carbon and silicon having a proportion of carbon to silicon different from that of the base coating; wherein the additional coating deposited over the base coating is formed essentially of an amorphous mixture of carbon and silicon having a proportion of carbon to silicon different from that of the base coating.

2. The invention according to claim 1 wherein the coatings are deposited on the first machine element by plasma CVD using plasma derived from a monomer gas which contains both carbon and silicon or from a mixture of monomer gases which contains carbon and silicon.

3. A machine assembly comprising:
first and second machine elements slidingly engaging one another;
said first machine element comprising:
a substrate of a metallic material; and
a hard-material coating deposited on said substrate and slidingly engaging the second machine element;
the hard-material coating including a base coat deposited directly onto the metallic substrate, said coat being essentially formed of an amorphous mixture of silicon and carbon according to the formula:

$Si_xC_{1-x}$, wherein x has a value greater than 0 and less than 1; and the hard-material coating including at least one additional coating deposited over the base coating; wherein the additional coating deposited over the base coating is formed essentially of an amorphous carbon; wherein the additional coating deposited over the base coating is formed essentially of amorphous carbon.

4. The invention according to claim 3 wherein the base coating is deposited on the first machine element by plasma CVD using plasma derived from a monomer gas which contains both carbon and silicon or from a mixture of monomer gases which contains carbon and silicon and the additional coating is deposited by plasma CVD using plasma derived from a monomer gas which contains carbon.

5. A process for making a machine assembly, said process comprising:
depositing a hard-material coating on a metallic-material substrate of a first machine element, said depositing including connecting the first machine element to the cathode or to the anode of a plasma CVD unit and applying a first coating to the first machine element by plasma CVD using plasma derived from a monomer gas which contains carbon and silicon or from a mixture of monomer gases which contains carbon and silicon;
assembling the first machine element with the hard-material coating thereof in sliding engagement with a second machine element; and wherein the plasma is produced with inductive excitation.

6. The invention according to claim 5, wherein said gas or mixture of gases contains hydrogen and at least one halogen, the ratio of hydrogen to halogen being high enough to prevent etching of the substrate.

7. A process for making a machine assembly, said process comprising:
depositing a hard-material coating on a metallic-material substrate of a first machine element, said depositing including connecting the first machine element to the cathode or to the anode of a plasma CVD unit and applying a first coating to the first machine element by plasma CVD using plasma derived from a monomer gas which contains carbon and silicon or from a mixture of monomer gases which contains carbon and silicon;
assembling the first machine element with the hard-material coating thereof in sliding engagement with a second machine element; and wherein the pressure of the gas or gas mixture in the deposition chamber of the plasma CVD unit ranges from $10^{-4}$ to 20 millibars.

8. A process for making a machine assembly, said process comprising:
depositing a hard-material coating on a metallic-material substrate of a first machine element, said depositing including connecting the first machine element to the cathode or to the anode of a plasma CVD unit and applying a first coating to the first machine element by plasma CVD using plasma derived from a monomer gas which contains carbon and silicon or from a mixture of monomer gases which contains carbon and silicon;
assembling the first machine element with the hard-material coating thereof in sliding engagement with a second machine element; and further comprising a step of bombarding the machine element before the step of depositing the coating, said step of bombarding being accomplished using insert gas ions which are not incorporated into the coating.

9. A process as defined in claim 8, wherein the inert gas is selected from the group consisting of argon, nitrogen, oxygen and hydrogen.

10. A process for making a machine assembly, said process comprising:
depositing a hard-material coating on a metallic-material substrate of a first machine element, said depositing including connecting the first machine element to the cathode or to the anode of a plasma CVD unit and applying a first coating to the first machine element by plasma CVD using plasma derived from a monomer gas which contains carbon and silicon or from a mixture of monomer gases which contains carbon and silicon;
assembling the first machine element with the hard-material coating thereof in sliding engagement with a second machine element; and wherein the step of depositing the coating on the machine element includes supporting the machine element on a workpiece holder in the plasma CVD unit and applying a radio-frequency to said workpiece holder.

11. A process as defined in claim 10, wherein the first machine element is supported on a grounded workpiece holder during the depositing of the first coating.

12. A process for making a machine assembly, said process comprising:
depositing a hard-material coating on a metallic-material substrate of a first machine element, said depositing including connecting the first machine element to the cathode or to the anode of a plasma CVD unit and applying a first coating to the first machine element by plasma CVD using plasma derived from a monomer gas which contains carbon and silicon or from a mixture of monomer gases which contains carbon and silicon;
assembling the first machine element with the hard-material coating thereof in sliding engagement with a second machine element; and wherein the potential difference between the plasma and the first machine element is at least 100 volts.

13. A process for making a machine assembly, said process comprising:
depositing a hard-material coating on a metallic-material substrate of a first machine element, said depositing including connecting the first machine element to the cathode or to the anode of a plasma CVD unit and applying a first coating to the first machine element by plasma CVD using plasma derived from a monomer gas which contains carbon and silicon or from a mixture of monomer gases which contains carbon and silicon;

assembling the first machine element with the hard-material coating thereof in sliding engagement with a second machine element; and wherein plasma is produced with capacitive excitation.

14. A machine assembly comprising: first and second machine elements slidingly engaging one another;
said first machine element comprising:
a substrate of a metallic material; and
a hard-material coating deposited on said substrate and slidingly engaging the second machine element;
the hard-material coating including a base coating deposited directly onto the metallic substrate, said coating being essentially formed of an amorphous mixture of silicon and carbon according to the formula:

$$Si_xC_{1-x},$$

wherein x has a value greater than 0 and less than 1; and said hard-material coating further including an outer coating applied over the base coating, said outer coating being formed essentially of another amorphous mixture of silicon and carbon according to the formula $Si_yC_{1-y}$ where the value of y is not equal to the value of x.

15. A machine assembly comprising:
a machine element of a metallic material and;
a hard-material coating deposited on the machine element and comprising a plurality of layered coatings, including:
an inward coating deposited on the machine element and being essentially formed of an amorphous mixture of silicon and carbon; and
at least one outward coating deposited over the inward coating, said outward coating being essentially formed of another amorphous mixture of silicon and carbon of a different composition from that of the inward coating or of amorphous carbon; and
said hand-material coating being in sliding engagement with a second machine element of the assembly.

16. The invention according to claim 15 wherein said coatings is applied by plasma CVD.

* * * * *